United States Patent [19]

Chari

[11] Patent Number: 5,404,105
[45] Date of Patent: Apr. 4, 1995

[54] MULTIPURPOSE HEARING AID MAINTENANCE DEVICE

[76] Inventor: Nallan C. A. Chari, 101 Wymore Rd., Suite 326, Altamonte Springs, Fla. 32714

[21] Appl. No.: 89,579

[22] Filed: Jul. 12, 1993

[51] Int. Cl.6 .......................................... G01N 27/416
[52] U.S. Cl. .................................. 324/426; 324/435; 206/333
[58] Field of Search .............. 324/158 R, 426, 435, 324/437, 506; 320/48; 340/636; 206/333, 373, 459.1; 221/198; 294/65.5

[56] References Cited

U.S. PATENT DOCUMENTS

| | | | |
|---|---|---|---|
| D. 214,088 | 5/1969 | Bellafiore | D52/6 |
| D. 302,074 | 7/1989 | Halasz | D3/62 |
| 3,753,095 | 8/1973 | Nichols | 324/437 |
| 3,939,400 | 2/1976 | Steele | 324/434 |
| 4,250,446 | 2/1981 | Ponte | 324/506 |
| 4,726,661 | 2/1988 | Parker | 324/104 |
| 5,129,546 | 7/1992 | Thielmann | 221/66 |
| 5,228,119 | 2/1994 | Crawford, Jr. et al. | 294/65.5 |
| 5,348,359 | 9/1994 | Boozer | 294/24 |

*Primary Examiner*—Kenneth A. Wieder
*Assistant Examiner*—Christopher Tobin

[57] ABSTRACT

This invention deals with a multipurpose hearing aid maintenance device. Its brush is used to clean a hearing aid, especially the receiver tube opening. The magnetized electrical terminal or an optional magnetic tip serves to hold small (size 13 or smaller) batteries to place them in a heating aid battery compartment or remove them from the compartment. Also, the magnetized electrical terminal holds the cell and serves as one of the two electrical terminals to test (GO/NO GO) electrical charge of the cells. Finally, the device can store one or two spare batteries.

5 Claims, 1 Drawing Sheet

MULTIPURPOSE HEARING AID MAINTENANCE DEVICE

FIELD OF THE INVENTION

This invention pertains to multipurpose maintenance devices used in the upkeep of small electronic devices such as hearing aids.

SUMMARY OF THE INVENTION

Several devices are available on the market for the maintenance of hearing aids. For example, the wax-loop device consists of a wire loop at one end and a cleaning brush at the other end of a plastic rod. The wire loop is used to loosen the hardened ear debris in the receiver opening of an in-the-ear hearing aid, and the brush is used to finish the rest of the cleaning operation. Some wax-loop devices are equipped with a small magnet to pick up batteries. Additionally, a recent entry in the market is a magnetic tool to pickup and release batteries by means of a push-button arrangement. Battery checkers, some with storage compartments, are also readily available. The problem with the battery checkers on the market is their inability to provide a satisfactory means of handling the small batteries for testing purposes. Accordingly, the purpose of the present invention is to design an inexpensive multipurpose hearing aid maintenance device to clean a hearing aid and, additionally, retrieve, test and store its batteries.

DETAILED DESCRIPTION

Figure 1:
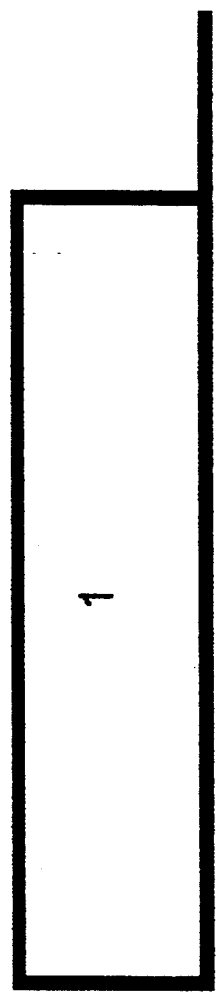
FIG. 1 is a cross section of the side view of the plastic tube housing used in the device.
Figure 2:
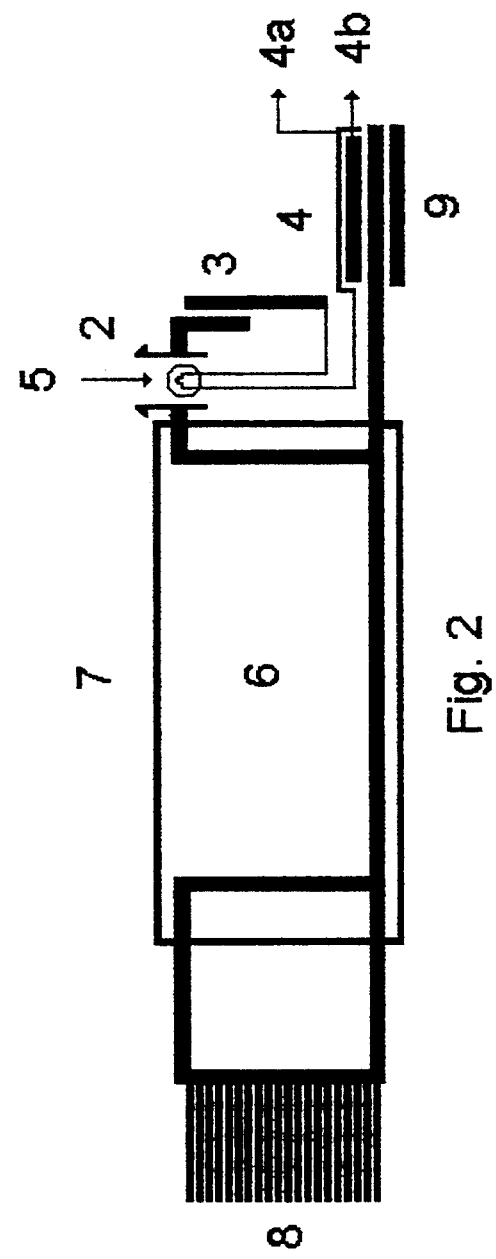
FIG. 2 is a detailed cross section of the side view of the device.

A cross section of the device is shown in the FIG. 1. It consists of a hollow plastic tube housing (1). At one end of the housing an L-shaped cut was made to accommodate electrical terminals. FIG. 2 shows the same cross section of the device with additional details. An opening was made on the top to accommodate an optional lamp housing (2). A slot (6) was cut about the middle of the housing to provide storage space for one or two batteries used in a hearing aid. A plastic sleeve (7) that slides over the tubing acts as a door for accessing battery storage (6). An alternate arrangement to create storage space for the spare batteries will be to use the hollow core of the housing to store the batteries, and use a snap on or screw section type cap fitted with a brush to gain access to the storage space. The other end of the tubing is fitted with a hard bristle brush (8). It should be noted the device can be made from many materials, and the shape of the device may assume many forms depending upon the manufacturing process, the cost of the materials and the labor. The electrical terminals (3 and 4) are attached to each leg of the L-shaped cut of the housing. Also, the housing can serve as one of the test terminals (4), if an electrically conductive material is chosen to manufacture it. The magnetized electrical contact (4) is an unique feature of the device. In the present device it is made by wrapping a copper strip (4a) around a rare earth magnet (4b). However, it should be obvious that any electrically conductive material can be substituted for the copper. Also, any electrically conductive magnetic material can serve as the terminal (4). An electrical test lamp (5) is wired to the terminals (3 and 4). The test lamp glows when a fully charged battery makes contact with the terminals (3 and 4). An optional magnet (9) may be attached to the housing to facilitate the removal or insertion of batteries whenever the magnetized electrical terminal (4) is inconvenient.

I claim:

1. A multipurpose hearing aid maintenance device comprising:

a hollow tubular housing with first and second ends, a storage compartment, and an opening which allows access to the storage compartment;

an outer sleeve portion which surrounds the hollow tubular housing and covers the opening;

a hard bristle hearing aid cleaning brush attached to the first end of the housing;

battery testing means attached to the second end of the housing, said battery testing means comprising a lamp, a lamp housing, a first battery terminal contact and a second battery terminal contact, wherein a positively tested battery will cause the lamp to glow when the battery terminals are respectively attached to the first and second battery terminal contacts; and, means for magnetizing the second battery terminal contact to secure a tested battery to the contact.

2. The multipurpose hearing aid maintenance device of claim 1, wherein the outer sleeve portion slidably engages with the hollow tubular housing to alternately cover and allow access to the storage compartment.

3. The multipurpose hearing aid maintenance device of claim 1, wherein a cap fitted with the hard bristle brush is detachably engaged with the first end of the housing to alternately cover and allow access to the storage compartment.

4. The multipurpose hearing aid maintenance device of claim 1, wherein the means for magnetizing the second battery terminal contact comprises an electrically conductive strip wrapped around a rare earth magnet.

5. The multipurpose hearing aid maintenance device of claim 1, further comprising an additional magnet attached to the second battery terminal contact.

* * * * *